(12) United States Patent
Choi et al.

(10) Patent No.: US 8,507,895 B2
(45) Date of Patent: Aug. 13, 2013

(54) ORGANIC LIGHT EMITTING DEVICE USING GRAPHENE

(75) Inventors: Jae-young Choi, Suwon-si (KR); Won-mook Choi, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 161 days.

(21) Appl. No.: 12/855,724

(22) Filed: Aug. 13, 2010

(65) Prior Publication Data

US 2011/0127497 A1    Jun. 2, 2011

(30) Foreign Application Priority Data

Dec. 1, 2009   (KR) .................. 10-2009-0117838

(51) Int. Cl.
 *H01L 29/08*    (2006.01)
(52) U.S. Cl.
 USPC .............................. 257/40; 977/742; 977/748

(58) Field of Classification Search
 USPC ...................... 257/40; 977/742, 748; 428/13
 See application file for complete search history.

(56) References Cited

U.S. PATENT DOCUMENTS

| | | | | |
|---|---|---|---|---|
| 7,645,497 | B2 * | 1/2010 | Spath et al. | 428/1.4 |
| 2007/0187694 | A1 | 8/2007 | Pfeiffer | |

FOREIGN PATENT DOCUMENTS

| | | |
|---|---|---|
| JP | 2001-267083 A | 9/2001 |
| KR | 1020090028007 A | 3/2009 |
| KR | 1020090043418 A | 5/2009 |
| KR | 1020090065206 A | 6/2009 |

\* cited by examiner

*Primary Examiner* — Howard Weiss
*Assistant Examiner* — Steven Rao
(74) *Attorney, Agent, or Firm* — Cantor Colburn LLP

(57) ABSTRACT

An organic light emitting device including graphene. The organic light emitting device includes a first electrode that is interposed between a transparent substrate and an organic layer emitting light, and includes graphene having a thickness of about 0.1 nanometer (nm) to about 10 nanometers (nm).

5 Claims, 1 Drawing Sheet

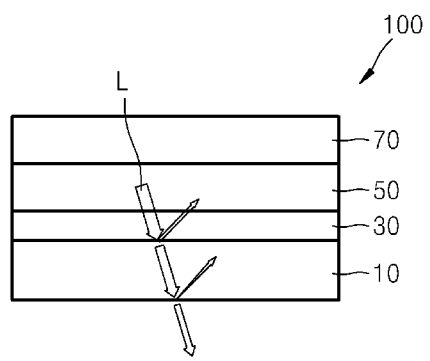

ORGANIC LIGHT EMITTING DEVICE USING GRAPHENE

CROSS-REFERENCE TO RELATED APPLICATIONS

This application claims priority to Korean Patent Application No. 10-2009-0117838, filed on Dec. 1, 2009, and all the benefits accruing therefrom under 35 U.S.C. §119, the disclosure of which is incorporated herein in its entirety by reference.

BACKGROUND

1. Field

Provided is a light emitting device, and more particularly, an organic light emitting device using graphene.

2. Description of the Related Art

An organic light emitting device ("OLED") is a self-emissive device, in which electrons and holes are combined in an organic light emitting layer, as a current or a voltage is applied to the organic light emitting layer, so as to emit light. In general, an anode is disposed on a substrate in an OLED, and an organic light emitting layer formed of an organic compound is formed on the anode, and a cathode is formed on the organic light emitting layer. Examples of the organic light emitting layer are organic thin layers such as a hole transport layer, an emission layer, an electron transport layer, etc. that are sequentially formed in a stack.

SUMMARY

Provided are organic light emitting devices in which leakage of light that is emitted from an organic light emitting layer and transmitted through a substrate is suppressed, and a light efficiency is improved.

Examples will be set forth in part in the description which follows and, in part, will be apparent from the description, or may be learned by practice of the illustrated examples.

Provided is an organic light emitting device including a transparent substrate, a first electrode disposed on the transparent substrate and including graphene, a second electrode disposed on the transparent substrate and separated apart from the first electrode, and an organic layer interposed between the first electrode and the second electrode, and including an emission layer. The first electrode has a thickness of about 0.1 nanometer (nm) to about 10 nanometers (nm).

The first electrode may have a thickness of about 0.35 nm to about to 5 nm.

The first electrode may have a visible light transparency of about 70% to about 99%.

The organic light emitting device may further include at least one selected from the group consisting of a hole injection layer and a hole transport layer, disposed between the first electrode and the emission layer.

The organic light emitting device may further include at least one selected from the group consisting of an electron injection layer, an electron transport layer, and a hole blocking layer, disposed between the emission layer and the second electrode.

As graphene has flexibility, the organic light emitting device having flexibility may be manufactured.

BRIEF DESCRIPTION OF THE DRAWINGS

These and/or other aspects will become apparent and more readily appreciated from the following description of the embodiments, taken in conjunction with the accompanying drawing of which:

FIG. 1 is a cross-sectional view illustrating an embodiment of an organic light emitting device according to the present invention.

DETAILED DESCRIPTION

Reference will now be made in detail to embodiments, examples of which are illustrated in the accompanying drawings, wherein like reference numerals refer to the like elements throughout. In this regard, the embodiments may have different forms and should not be construed as being limited to the descriptions set forth herein. Accordingly, the embodiments are merely described below, by referring to the figures, to explain aspects of the present invention. In the drawings, the size and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

FIG. 1 illustrates an embodiment of an organic light emitting device 100 according to the present invention.

Referring to FIG. 1, the organic light emitting device 100 includes a structure in which a first electrode 30, an organic layer 50, and a second electrode 70 are sequentially stacked on a transparent substrate 10.

The transparent substrate 10 may be a substrate that is used in typical organic light emitting devices. In an exemplary embodiment, the transparent substrate 10 may be a glass substrate or a transparent plastic substrate which has good mechanical intensity, thermal stability, transparency, surface planarization characteristics, easy processability, and/or waterproof characteristics. Furthermore, the transparent substrate 10 may include a flexible material, so that a display device using the organic light emitting device 100 may have flexibility.

The first electrode 30 and the second electrode 70 are respectively disposed directly on opposing two surfaces of the organic layer 50, and supply a current or a voltage to the organic layer 50. The first electrode 30 will be described in detail later.

The second electrode 70 includes a material having good conductivity. Furthermore, since light is emitted toward the transparent substrate 10, the second electrode 70 may include a material having good reflectivity. In one exemplary embodiment, the second electrode 70 may include Ag, Mg, Al, Pt, Pd, Au, Ni, Nd, Ir, Cr or a compound of these aforementioned materials.

The organic layer 50 includes an emission layer, and may include a small molecule organic material or a polymer organic material. The organic layer 50 may further include at least one layer selected from the group consisting of a hole injection layer ("HIL"), a hole transport layer ("HTL"), a hole blocking layer, an electron transport layer ("ETL"), and an electron injection layer ("EIL"). In an embodiment, the organic layer 50 including the emission layer, may further include at least one selected from the group consisting of a hole injection layer and a hole transport layer, disposed between the first electrode 30 and the emission layer. In another embodiment, the organic layer 50 including the emission layer, may further include at least one selected from the group consisting of an electron injection layer, an electron transport layer, and a hole blocking layer, disposed between the emission layer and the second electrode.

In one exemplary embodiment, when the organic layer 50 includes a small molecule organic material, a hole injection layer, a hole transport layer, an emission layer, an electron transport layer, and/or an electron injection layer may be stacked in a single layer or multilayer structure. Examples of the organic material include, but are not limited to, copper phthalocyanine (CuPc), N,N'-Di(naphthalene-1-yl)-N,N'-diphenyl-benzidine (NPB), tris-8-hydroxyquinoline aluminum (Alq3), and other suitable various materials.

In an embodiment of a method, the small molecule organic material may be formed using, for example, a vacuum deposition method using masks. When the organic layer 50 includes a polymer organic material, it may include a hole transport layer ("HTL") and an emission layer ("EML"), and the hole transport layer may include polyethylene dioxythiophene ("PEDOT") and the emission layer may include a polymer organic material such as a poly-phenylenevinylene ("PPV")-based material and a polyfluorene ("PFO")-based material.

As used herein, the "organic layer" refers to all of layers interposed between the first electrode 30 and the second electrode 70. In an alternative embodiment, the organic layer 50 may also include a metal complex, and the organic layer 50 does not necessarily include a layer formed of only an organic material.

The first electrode 30 includes graphene, and has a thickness of about 0.1 nanometer (nm) to about 10 nanometers (nm). The thickness is taken, for example, in a direction perpendicular to a plane of the transparent substrate 10.

As used herein, "graphene" refers to a polycyclic aromatic molecule in which a plurality of carbon atoms are bonded to each other in a covalent bond. The carbon atoms bonded in a covalent bond are basic repeating units that form a six-membered ring, but may also further include a five-membered ring and/or a seven-membered ring. As a result, graphene looks like a single layer including carbon atoms that are in covalent bonding, usually $sp^2$-bonded. The graphene may be a single layer or a plurality of the graphenes may be stacked.

The graphene may be manufactured using conventional methods. In one embodiment, a graphene sheet may be formed and then be cut into predetermined sizes or be directly grown on a substrate. The graphene may be manufactured, for example, using a method disclosed in Korean Patent Laid-Open Gazette No. 2009-0043418. Graphene may have a surface area of 1 square millimeter ($mm^2$) or greater, for example, a surface area of about 1 $mm^2$ to about 100 $m^2$ or a surface area of about 1 $mm^2$ to about 25 $m^2$.

Also, graphene exists at 99% or more per a unit surface area of 1 $mm^2$; for example, graphene may exist at about 99% to about 99.999% per a unit surface area of 1 $mm^2$. The graphene may exist uniformly in the above range, and may show uniform electric characteristics accordingly.

Graphene has an abnormal half-integer quantum hall effect regarding electrons and holes. Also, electron mobility of graphene known until the present is as high as about 20,000 square centimeters per volt second (cm²/Vs) to about 50,000 cm²/Vs.

The first electrode 30 according to the illustrated embodiment of the present invention may include graphene having a thickness of about 0.1 nm to about 10 nm, in a single layer structure or a multilayer structure. In one embodiment, the first electrode 30 may preferably include graphene having a thickness of about 0.35 nm to about 5 nm. When the thickness of the first electrode 30 is less than 0.1 nm, surface resistance may be too low or layers of graphene may not be uniform. Also, when the thickness of the first electrode 30 is 10 nm or greater, light loss may be generated due to beam leakage in the first electrode 30. The thickness of the first electrode 30 may be determined in consideration of uniformity of graphene or a wavelength of light.

Table 1 below shows light efficiency of the organic light emitting device according to the illustrated embodiment of the present invention and those of comparative examples.

TABLE 1

|  | Embodiment of the present invention | Comparative example 1 | Comparative example 2 |
| --- | --- | --- | --- |
| Material of the first electrode | graphene | ITO | Ni |
| Thickness of the first electrode | 3 nm | 100 nm | 10 nm |
| Transmittance | 90% | 86% | 29% |
| Surface resistance | 10 ohms per square (Ω/sq.) | 14 ohms per square (Ω/sq.) | 33 ohms per square (Ω/sq.) |
| Work function | ~4.5 electron volt (eV) | 5.0 electron volt (eV) | 5.1 electron volt (eV) |
| Light efficiency | 80% | 25% | 23% |

According to the illustrated embodiment of the present invention, graphene having a thickness of 3 nm was used as the first electrode. In Comparative example 1, an indium tin oxide ("ITO") having a thickness of 100 nm was used as a first electrode. and in Comparative example 2, Ni having a thickness of 10 nm was used as a first electrode, which will be referred to as a Ni electrode. The structures of the organic light emitting devices of the illustrated embodiment of the present invention and Comparative examples 1 and 2 are the same, except the first electrodes. That is, in the illustrated embodiment of the present invention and Comparative examples 1 and 2, a transparent substrate 10, an organic layer 50, and a second substrate 70 include a glass substrate, Poly (3,4-ethylenedioxythiophene) poly(styrenesulfonate) ("PEDOT:PSS") and PFO, and Al, respectively.

Referring to Table 1, the ITO electrode of Comparative example 1 needs to have a thickness of at least 100 nm in order to obtain a sufficient surface resistance. Transmittance of the ITO electrode is high as about 86%, but a thickness of the ITO electrode has a similar order compared to a wavelength band of visible light of 380 nm to 780 nm. Thus, the ITO electrode functions as a waveguide for light being emitted, thereby causing light loss due to beam leakage. Light loss due to the beam leakage is known to be about 60%.

In contrast, according to the illustrated embodiment of the present invention, since electron mobility of graphene is considerably high, a sufficiently low surface resistance may be provided using a graphene electrode having a thickness of 3 nm, and since this thickness of 3 nm is far smaller than the wavelength band of visible light, light loss due to beam leakage in the graphene electrode is not generated.

In further contrast, the Ni electrode of Comparative example 2 is relatively thin as 10 nm, thereby suppressing light loss due to beam leakage in the Ni electrode. However, light transmittance of the Ni electrode is low.

As a result, Comparative examples 1 and 2 have light efficiencies of about 25% and 23%, respectively, but the organic light emitting device according to the illustrated embodiment of the present invention has a light efficiency of about 90%, indicating that the light efficiency of the embodiment of the present invention is three times greater than those of Comparative examples 1 and 2.

Graphene may be thin, and thus a surface roughness thereof may be good. Accordingly, in an embodiment, the first electrode 30 including a graphene may have a very smooth surface at the nano-size level, thereby allowing a uniform current flow through the organic layer 50 when power source is supplied to the organic light emitting device 100. Consequently, a lifespan of the organic light emitting device 100 may be increased.

In an embodiment, when the organic light emitting device 100 is arranged as an array to form an organic light emitting display apparatus, a wiring circuit (not shown) that supplies power source to the organic light emitting device 100 may be disposed in the transparent substrate 10. In addition, when the organic light emitting display apparatus is an active type, a pixel circuit (not shown) such as a thin film transistor ("TFT") may be further disposed on the transparent substrate 10.

Graphene has excellent flexibility, and thus a bendable transparent electrode may be manufactured, such as being the first electrode 30 in the present invention. Thus, by using the organic light emitting device 100 according to the illustrated embodiment of the present invention that uses graphene as the first electrode 30, a flexible display apparatus may be manufactured.

In addition, although the transparent first electrode 30 of the organic light emitting device 100 may includes graphene in the illustrated embodiment of the present invention, graphene may also be used to minimize beam leakage in the transparent electrode of, for example, solar cells, which also use the transparent electrodes.

By using the organic light emitting device 100 including the above-described graphene, beam leakage of the first electrode 30 disposed between the organic light emitting layer and the substrate may be suppressed, thereby increasing a light efficiency.

It should be understood that the embodiments described therein should be considered in a descriptive sense only and not for purposes of limitation. Descriptions of features or aspects within each embodiment should typically be considered as available for other similar features or aspects in other embodiments.

What is claimed is:

1. An organic light emitting device comprising:
    a transparent substrate;
    a first electrode disposed on the transparent substrate and including graphene;
    a second electrode disposed on the transparent substrate and separated apart from the first electrode; and
    an organic layer interposed between the first electrode and the second electrode, and comprising an emission layer,
    wherein the first electrode has a thickness of about 0.35 nanometer (nm) to about 5 nanometers (nm).

2. The organic light emitting device of claim 1, wherein the first electrode has a visible light transparency of about 70% to about 99%.

3. The organic light emitting device of claim 1, further comprising at least one selected from the group consisting of a hole injection layer and a hole transport layer, disposed between the first electrode and the emission layer.

4. The organic light emitting device of claim 1, further comprising at least one selected from the group consisting of an electron injection layer, an electron transport layer, and a hole blocking layer, disposed between the emission layer and the second electrode.

5. The organic light emitting device of claim 1, wherein the first electrode has flexibility.

* * * * *